(12) United States Patent
Tagano et al.

(10) Patent No.: US 8,701,971 B2
(45) Date of Patent: Apr. 22, 2014

(54) PRINTED BOARD AND BUS BAR ASSEMBLY

(75) Inventors: Masahiro Tagano, Yokkaichi (JP);
Teruyuki Kitahara, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 111 days.

(21) Appl. No.: 13/313,293

(22) Filed: Dec. 7, 2011

(65) Prior Publication Data

US 2012/0074208 A1 Mar. 29, 2012

Related U.S. Application Data

(62) Division of application No. 11/892,600, filed on Aug. 24, 2007, now Pat. No. 8,094,461.

(30) Foreign Application Priority Data

Oct. 2, 2006 (JP) ................................. 2006-270550

(51) Int. Cl.
*B23K 1/20* (2006.01)
*H01R 9/22* (2006.01)
*H05K 1/11* (2006.01)

(52) U.S. Cl.
USPC ........ 228/173.1; 361/772; 361/774; 361/775; 29/830

(58) Field of Classification Search
USPC .................. 228/173.1; 361/772–775; 29/830
See application file for complete search history.

(56) References Cited

U.S. PATENT DOCUMENTS

| | | | |
|---|---|---|---|
| 3,673,680 A * | 7/1972 | Tanaka et al. .................... 29/837 |
| 3,849,870 A * | 11/1974 | Cobaugh et al. ........... 228/173.1 |
| 4,066,326 A * | 1/1978 | Lovendusky ................. 439/873 |
| 4,266,091 A | 5/1981 | Fukuda |
| 4,351,609 A | 9/1982 | Inoue et al. |
| 4,420,653 A | 12/1983 | Fukuda et al. |
| 4,536,826 A | 8/1985 | Ahiskali |
| 5,329,424 A | 7/1994 | Patel |
| 5,604,332 A | 2/1997 | Ikeda et al. |
| 6,473,291 B1 | 10/2002 | Stevenson |

FOREIGN PATENT DOCUMENTS

| | | | |
|---|---|---|---|
| EP | 105044 A1 * | 4/1984 |
| JP | 06215814 A * | 8/1994 |
| JP | U-06-072271 | 10/1994 |
| JP | A-08-172255 | 7/1996 |
| JP | A-2000-252664 | 9/2000 |
| JP | A-2006-060140 | 3/2006 |

\* cited by examiner

*Primary Examiner* — Devang R Patel
(74) *Attorney, Agent, or Firm* — Oliff PLC

(57) ABSTRACT

A printed board includes a printed board body having a first side, a second side opposing the first side, and a through-hole; a printed conductor disposed on the first side of the printed board body; and a bus bar disposed on the second side of the printed board body, the bus bar including a terminal that extends through the through-hole. The terminal includes a plurality of branched terminal portions at a position corresponding to an interior of the through-hole, and at least one of the branched terminal portions is bent and attached to the printed conductor.

3 Claims, 9 Drawing Sheets

PRIOR ART

PRINTED BOARD AND BUS BAR ASSEMBLY

This is a Division of application Ser. No. 11/892,600 filed Aug. 24, 2007, which claims priority of Japanese Application No. 2006-270550 filed Oct. 2, 2006. The disclosure of the prior applications is hereby incorporated by reference herein in their entirety.

BACKGROUND

1. Technical Field

This invention relates to a printed board and a method for producing the printed board. In a printed board to which a bus bar is attached, embodiments of the present invention can prevent a failure in the connection between the bus bar and the printed board.

2. Background Art

An electrical junction box is mounted on a vehicle, such as a motor vehicle. Electronic parts to be mounted on the vehicle are arranged on a printed board. Based on the rapid increase in the amount of electronic parts, the electrical junction box generally contains a printed board provided with electronic parts. In some electric junction boxes, a bus bar is arranged on a printed board as an internal circuit. The bus bar and printed board are interconnected by a reflow process. In the reflow process, bonders (e.g., solder) are joined to the bus bar and printed board. The bonders, bus bar and printed board are placed in a reflow furnace under a high temperature atmosphere, and the bonders are melted to interconnect the bus bar and the printed board.

Some bus bars contain one or more terminals. When the bus bar and printed board are bonded by the reflow process, the terminal can dislodge and float upward from a through-hole in the printed board due to a difference in coefficient of thermal expansion between the printed board and the bus bar under the high temperature atmosphere. This dislodging can occur unless the terminal of the bus bar is securely held in the through-hole in the printed board. If such a condition occurs during melting of the bonders, the bus bar cannot be reliably bonded to the printed board and a failure in connection between them will occur. Accordingly, in the reflow process, it is necessary to carry out bonding work while the bus bar is positively held on the printed board so that the bus bar does not float up from the printed board.

There is a related-art bonding method in which a bus bar is prevented from falling off of a printed board by soldering the bus bar and the printed board after a portion of one or more of the terminals of the bus bar are pressed into a portion of one or more through-holes.

However, in the case where all of the terminals are pressed into all of the through-holes, respectively, it is possible that some terminals cannot be inserted into the through-holes based on small tolerances between the terminal of the bus bar and the through-hole in the printed board. On the other hand, in the case where a part of terminals are pressed into a part of through-holes, respectively, the other terminals except the terminals pressed in the through-holes tend to float up from the printed board based on a difference in the coefficient of thermal expansion of the printed board with respect to the bus bar when the printed board is exposed to a high temperature in a reflow furnace. In this case, the terminals are secured to the printed board in a state of floating-up. Consequently, in either case, a failure will occur in connection between the bus bar and the printed board.

In another related-art bonding method, a bus bar is arranged on one side of a printed board and a terminal of the bus bar is inserted into a through-hole in the printed board. Subsequently, a jig holds the bus bar on the printed board to prevent falling-off, and the printed board along with the jig is conveyed into a reflow furnace to melt solder, thereby interconnecting the bus bar and printed board.

In this case, since the solder is bonded on the jig, it is necessary to clean the jig. Furthermore, since the jig is exposed to a high temperature atmosphere, a new jig is required for every printed board. This will require a number of spare jigs and thus will increase cost.

In order to overcome the above problems, there is a bonding method in which after a terminal of a bus bar is inserted into a through-hole in a printed board, a distal end of the terminal is clinched or bent onto the printed board to prevent the terminal from falling off from the printed board and then a soldering step is effected.

JP 2006-60140A1 discloses a soldering method wherein a distal end of a terminal to be inserted into a printed board is clinched and soldered to the printed board. As shown in FIG. 9 of the present application, a pair of leading terminal portions 2a of an electrical part 2 are inserted into through-holes in a printed board 1, projecting ends 2b of the leading terminal portions 2a protrude out on the opposite side of the printed board 1, the projecting ends 2b are bent at an angle of about 90 degrees by clinching, and a solder H electrically interconnects the printed board 1 and the electrical part 2.

However, since the leading terminal portions 2a are bent at an angle of about 90 degrees, the projecting ends 2b of the leading terminal portions 2a come into contact with the printed board 1, thereby damaging the printed board 1.

SUMMARY

In view of the above problems, an object of embodiments of the present invention is to reduce the risk of failure in connection between a bus bar and a printed board by bonding them while preventing the bus bar on the printed board from falling off.

In order to overcome the above problems, embodiments of the present invention include a printed board with a printed board body and a bus bar. The bus bar is disposed on one side of the printed board body. A terminal extending from the bus bar is inserted into a through-hole in the printed board body and bonded, e.g. by soldering, to a printed conductor provided on the other side of the printed board body. The terminal extending from the bus bar is provided with a plurality of branched terminal portions at a position corresponding to the interior of the through-hole and at least one of the branched terminal portions is bent and bonded to the printed conductor.

According to the above construction, since it is possible to prevent the bus bar from falling off from the printed board body by bending the branched terminal portions extending from the bus bar, it is possible to prevent the bus bar from floating up from the printed board body because of a difference in coefficient of thermal expansion between the bus bar and the printed board body in the reflow process. Accordingly, since the bus bar and printed board body are reliably interconnected by the bonder, it is possible to reduce the risk of failure in the connection between the bus bar and the printed board body.

Also, since a fixing jig is not needed to push the bus bar onto the printed board body so that the bus bar does not float up from the body when the bus bar is soldered to the printed board body, the fixing jig is not required for every printed board body. This will lower the cost for producing jigs, reduce the number of parts, and require no space for storing the jig.

In some embodiments, the terminal extending from the bus bar is branched into two terminal portions at a position corresponding to the interior of the through-hole. The branched terminal portions are bent away from each other and bonded to the printed conductor.

According to the above construction, since it is possible to reliably prevent the bus bar from falling off from the printed board body by bending the two branched terminal portions, it is possible to prevent the bus bar from floating up from the printed board body. Accordingly, the bus bar is positively soldered to the printed board body thereby reducing the risk of failure in the connection between the bus bar and the printed board body.

Moreover, since the two branched terminal portions are bent away from each other in the through-hole, it is possible to stably hold the bus bar on the printed board body, even if the printed board body is inclined or an external load is applied to the bus bar.

The branched terminal portions may be bent in any direction so long as the portions are displaced away from each other. The bending directing may be changed in accordance with a general configuration of the bus bar, an assembling step, or the like. An angle of bending the terminal portions is preferably 80 to 100 degrees, although the angle is not limited to this range.

As described above, since it is possible to reliably prevent the bus bar from falling off from the printed board body and to hold the bus bar on the printed board body against falling-off by bending the two branched terminal portions, it is possible to prevent the bus bar from floating up from the printed board body. Accordingly, the bus bar is positively bonded to the printed board body and therefore it reduces the possibility of failure in the connection between the bus bar and the printed board body.

Also, since it is not necessary for a fixing jig to push the bus bar onto the printed board body so that the bus bar does not float up from the body when the bus bar is bonded to the printed board body, the fixing jig is not required for every printed board body. This will lower the cost for producing jigs and reduce the number of parts needed.

Furthermore, since the two branched terminal portions are bent away from each other, it is possible to stably hold the bus bar on the printed board body and to prevent the bus bar from falling off from the printed board body, even if the printed board body is inclined or an external load is applied to the bus bar.

BRIEF DESCRIPTION OF THE DRAWINGS

Exemplary embodiments are described below with reference to the drawings, wherein like numerals illustrate like parts.

FIG. 1A is a front elevation view. FIG. 1B is a right side elevation view of FIG. 1A.

FIG. 2A is a perspective view of the bus bar. FIG. 2B is a right side elevation view of FIG. 2A.

FIG. 3A is an enlarged section view of a through-hole, illustrating a first step. FIG. 3B is a cross section view of the through-hole taken along line A-A in FIG. 3A.

FIG. 4A is an enlarged section view of the through-hole, illustrating a second step. FIG. 4B is a cross section view of the through-hole taken along lines B-B in FIG. 4A.

FIG. 5A is an enlarged section view of the through-hole, illustrating a third step. FIG. 5B is a cross section view of the through-hole taken along lines C-C in FIG. 5A.

FIG. 6A is an enlarged section view of a through-hole in a second embodiment, illustrating a second step. FIG. 6B is a cross section view of the through-hole taken along lines D-D in FIG. 6A.

FIG. 7A is a front elevation view of an alteration of the branched terminal portions in the second embodiment, illustrating a first step. FIG. 7B is a front elevation view of the branched terminal portions, illustrating a second step.

FIG. 8A is a front elevation view of the branched terminal portions in a third embodiment, illustrating a second step of bending the one of the branched terminal portions. FIG. 8B is a front elevation view of the branched terminal portions, illustrating a second step of bending the other of the branched terminal portions.

DETAILED DESCRIPTION OF EMBODIMENTS

Figure 1A:
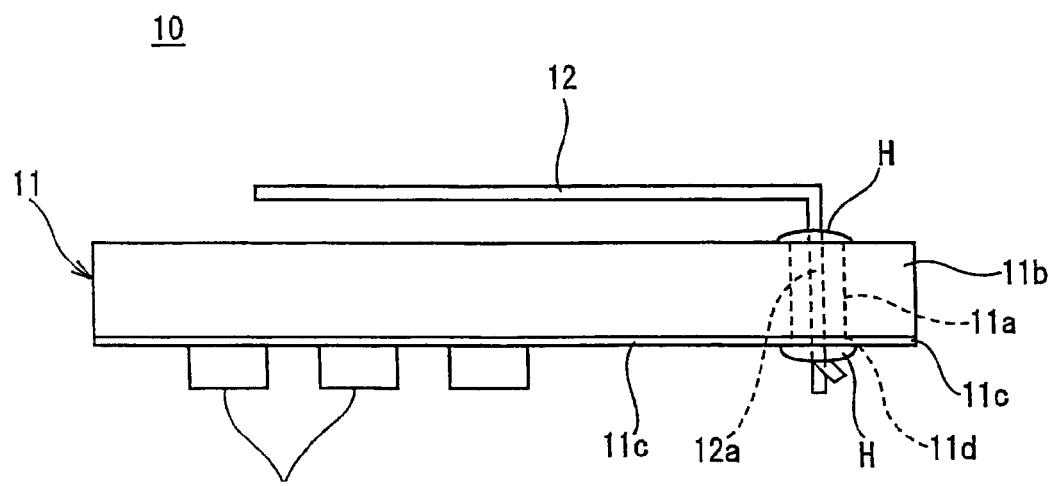
FIGS. 1A and 1B show an exemplary embodiment of a printed board.

Referring now to the drawings, exemplary embodiments of the present invention will be described below.

Figure 1B:
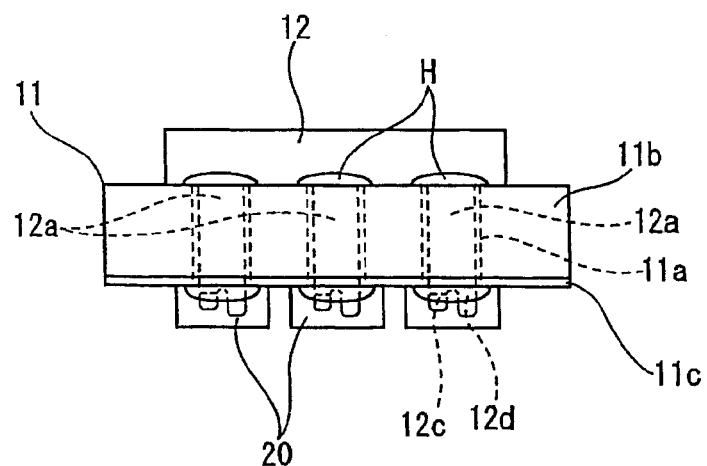

As shown in FIGS. 1A and 1B, an exemplary embodiment of a printed board 10 invention includes a printed board body 11 on which electronic parts 20 are mounted, and a bus bar 12 bonded, e.g., by soldering, to the printed board body 11 by a reflow process. A terminal 12a provided on the bus bar 12 is inserted into a through-hole 11a in the printed board body 11.

The printed board body 11, as shown in FIGS. 1A and 1B, can include an insulation board 11b and a conductor 11c printed on one side of the insulation board 11b. The electronic parts 20 are mounted on the printed conductor 11c.

Figure 3A:
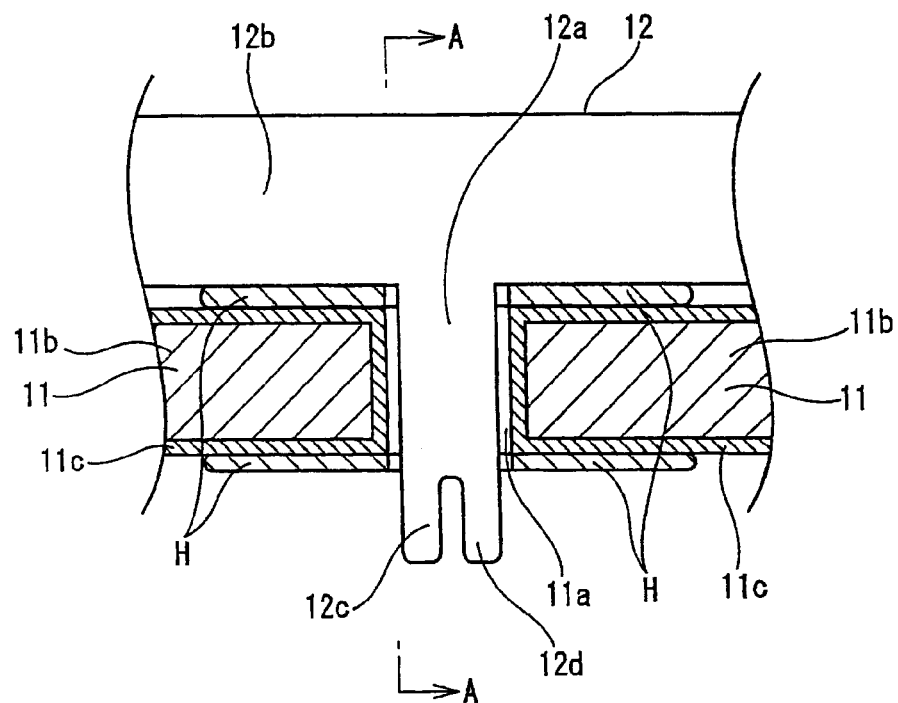
FIGS. 3A and 3B show a through-hole.

The printed board body 11 includes through-holes 11a that extend through the insulation board 11b and the printed conductor 11c. As shown in FIG. 3A, lands are provided on the opposite sides of the printed board body 11 around the through-holes 11a.

Figure 2A:
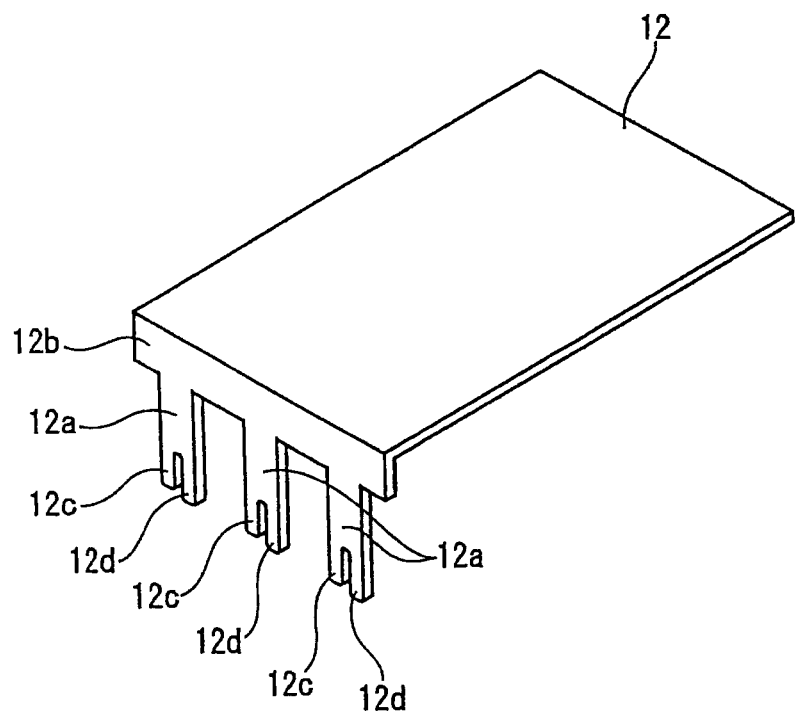
FIGS. 2A and 2B show other views of the bus bar shown in FIG. 1A.
Figure 2B:
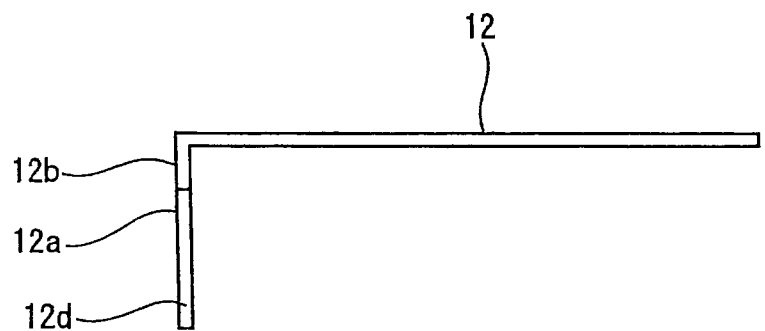

The bus bar 12, as shown in FIGS. 2A and 2B, can be formed into an L-shaped configuration having a bent portion 12b at an end of the flat bus bar 12. The terminals 12a extend from an end of the bent portion 12b of the bus bar 12 to be opposed to the through-holes 11a. It will be appreciated that, instead of a bus bar with an L-shaped configuration, various other bus bar shapes can be used. Further, while the Figures generally show that the branched terminal portions 12c and 12d appear to be U-shaped, various other shapes can also be used. Additionally, the branched terminal portions 12c and 12d need not be the same length or width.

Each terminal 12a of the bus bar 12 has branched terminal portions 12c and 12d located at a position on the bus bar that is inserted into the through-hole 11a. The branched terminal portions 12c and 12d enter the through-hole 11a and protrude from the through-hole 11a. One of the branched terminal portions (i.e., 12c in FIG. 4B) can be clinched by a jig 30 and bent in a thickness direction of the bus bar 12 by the jig 30.

Figure 4A:
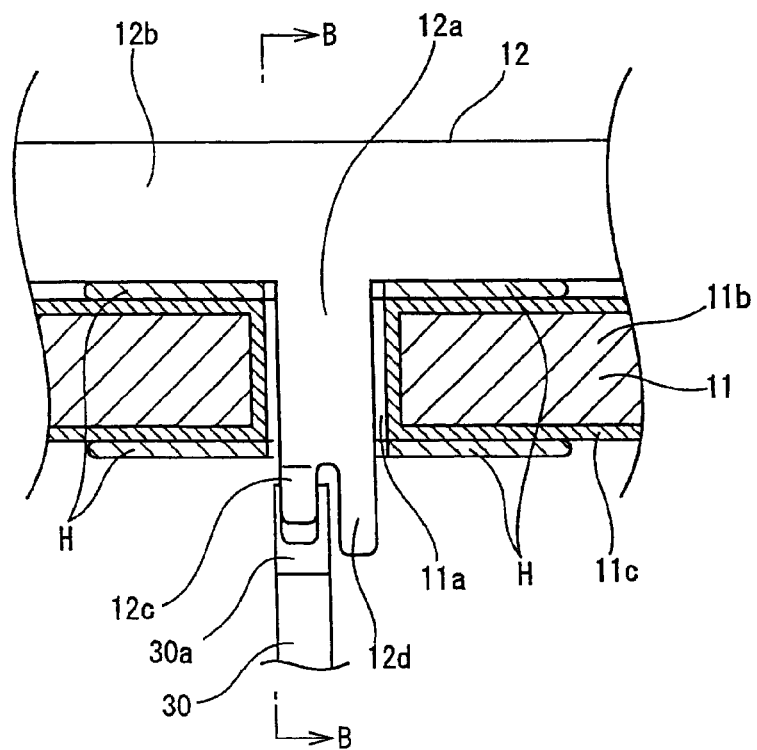
FIGS. 4A and 4B show the through hole.
Figure 4B:
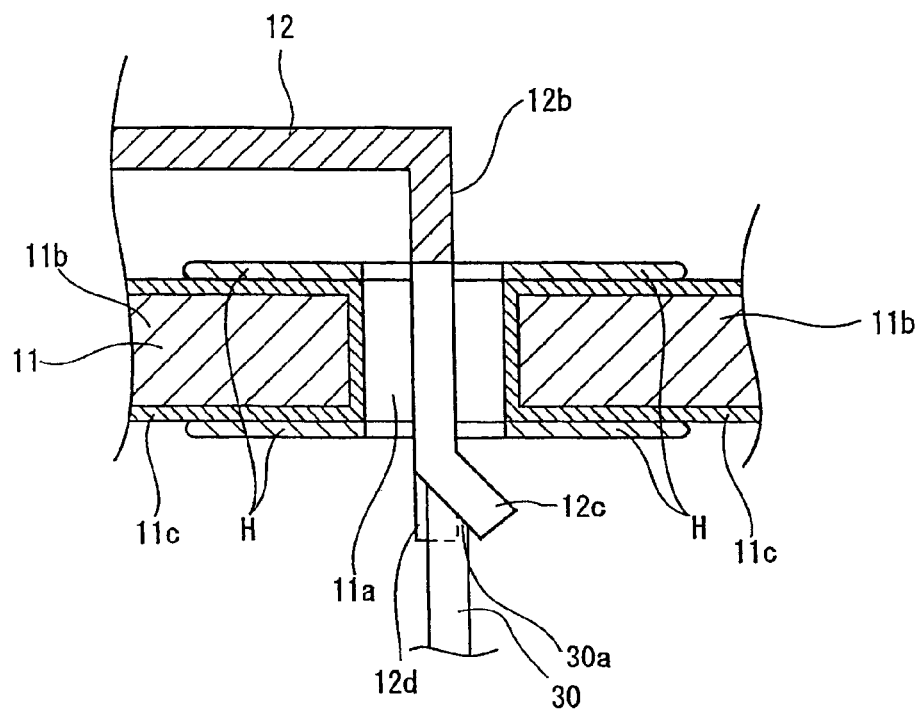

As shown in FIGS. 4A and 4B, the bar-like jig 30 can include a slant surface 30a on a distal end of the jig. The branched terminal portions 12c are bent in the thickness direction of the bus bar 12 when the slant surface 30a pushes the branched terminal portions 12c upward in the thickness direction of the bus bar 12.

When the bus bar 12 is bonded to the printed board body 11, a bonder H flows into the through-hole 11a to electrically connect the bus bar 12 on one side of the printed board body 11 to the printed conductor 11c on the other side of the printed board body 11.

Next, an exemplary method for producing a printed board of the present invention will be described below.

Figure 3B:
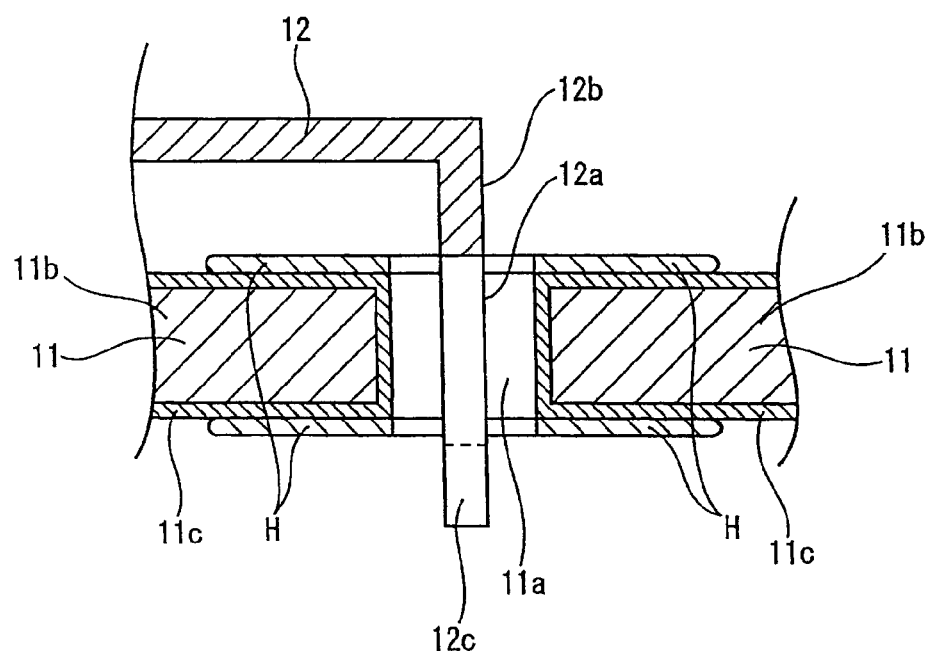

FIGS. 3A and 3B show a first step in a method for producing an embodiment of a printed board. In a bonding step, a bonder H is previously bonded on the periphery of each through-hole 11a in the printed board body 11. When the bus bar 12 is disposed on one side of the printed board body 11, the terminals 12a of the bus bar 12 are inserted into the through-holes 11a in the printed board body 11 so that distal ends of the terminals 12a protrude from the other side of the printed board body 11. As a result, the branched terminal portions 12c and 12d project from the other side of the printed board body 11 on which the printed conductor 11 is formed.

FIGS. 4A and 4B show a second step in a method for producing an embodiment of a printed board. The slant surface 30a on the distal end of the jig 30 contacts the branched terminal portions 12c that project from the printed conductor 11c. Subsequently, the jig 30 is pushed up so that the jig clinches the branched terminal portions 12c to bend them in the thickness direction of the printed board body 11. Consequently, the bus bar 12 is held on the printed board body 11.

Figure 5A:
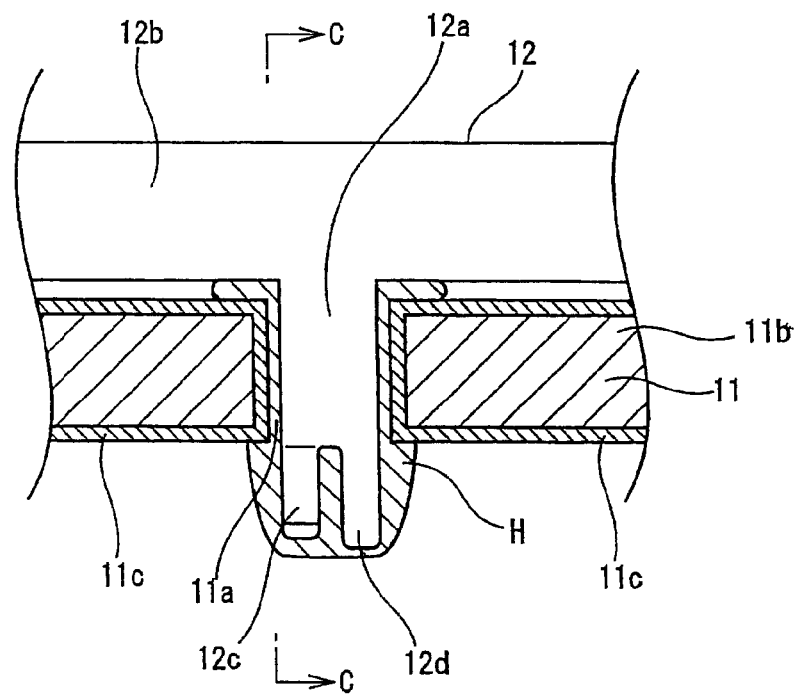
FIGS. 5A and 5B show the through hole.
Figure 5B:
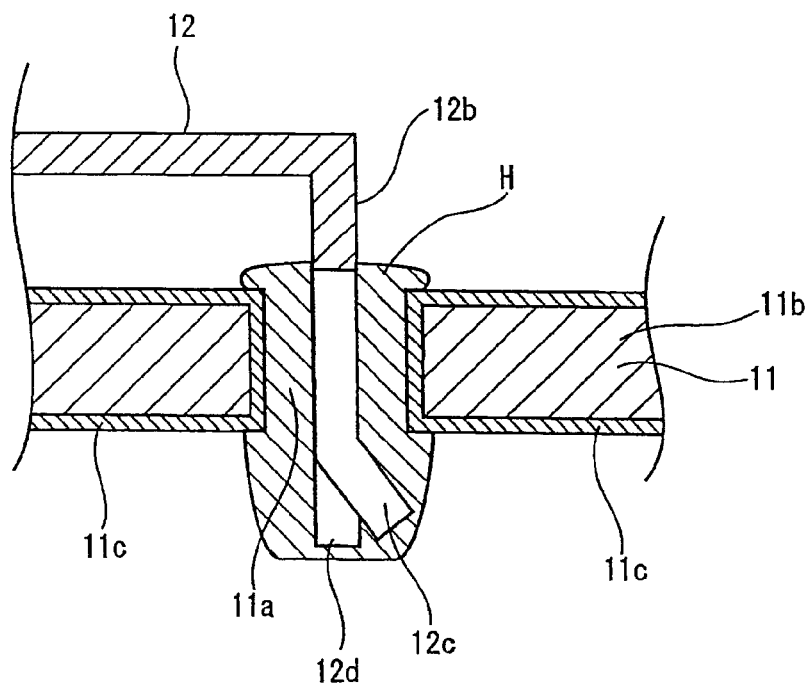

FIGS. 5A and 5B show a third step in a method for producing an embodiment of a printed board. The printed board body 11 that holds the bus bar 12 is placed in a reflow furnace. The bonders H bonded around the through-holes 11a are melted under a high temperature atmosphere and flow into the through-holes 11a to interconnect the terminals 12a of the bus bar 12 and the printed conductor 11c on the printed board body 11.

According to the above construction, since it is possible to prevent the bus bar 12 from falling off from the printed board body 11 by bending the branched terminal portions 12c extending from the bus bar 12, it is possible to prevent the bus bar 12 from floating up from the printed board body 11 on account of a difference in thermal expansion between the bus bar 12 and the printed board body 11 in the reflow process. Accordingly, since the bus bar 12 and printed board body 11 are reliably interconnected by the bonders, it is possible to reduce the risk of failure in the connection between the bus bar 12 and the printed board body 11.

Figure 6A:
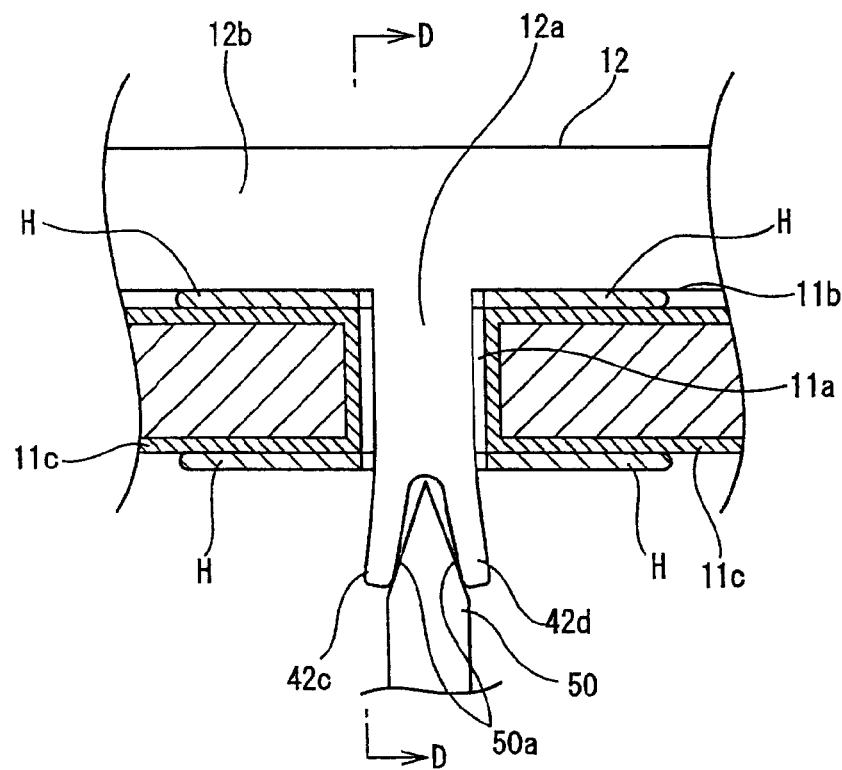
FIGS. 6A and 6B show a through hole according to a second embodiment.
Figure 6B:
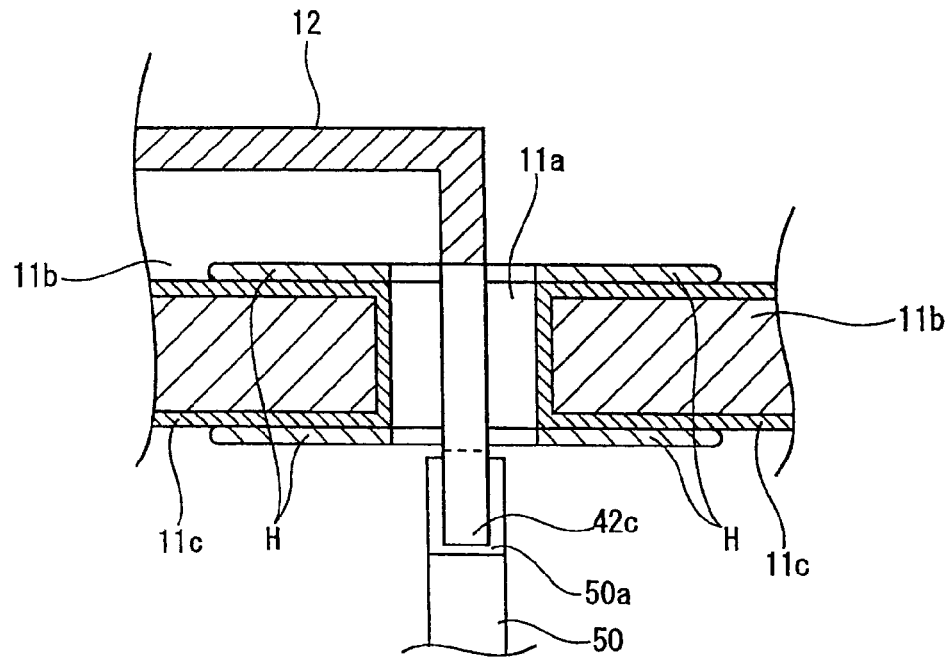

FIGS. 6A and 6B show a second embodiment of the printed board. The second embodiment differs from the first embodiment with respect to the fact that branched terminal portions 42c and 42d are bent away from each other in the thickness direction of the bus bar 12 and bonded to the printed board body 11.

The second embodiment differs from the first embodiment with respect to the second step in the method of producing the printed board. As shown in FIGS. 6A and 6B, a jig 50 has a triangular cross section at least at the distal end of the jig. The triangular cross-section has opposed slant surfaces 50a. The slant surfaces 50a of the jig 50 are inserted into a space between the branched terminal portions 42c and 42d, and the surfaces 50a clinch and bend the portions 42c and 42d while widening the portions 42c and 42d in a width direction.

According to the above construction, since the two branched terminal portions 42c and 42d are bent away from each other in the through-hole 11a, it is possible to stably hold the bus bar 12 on the printed board body 11 even if the printed board body 11 is inclined or an external load is applied to the bus bar 12.

Figure 7A:
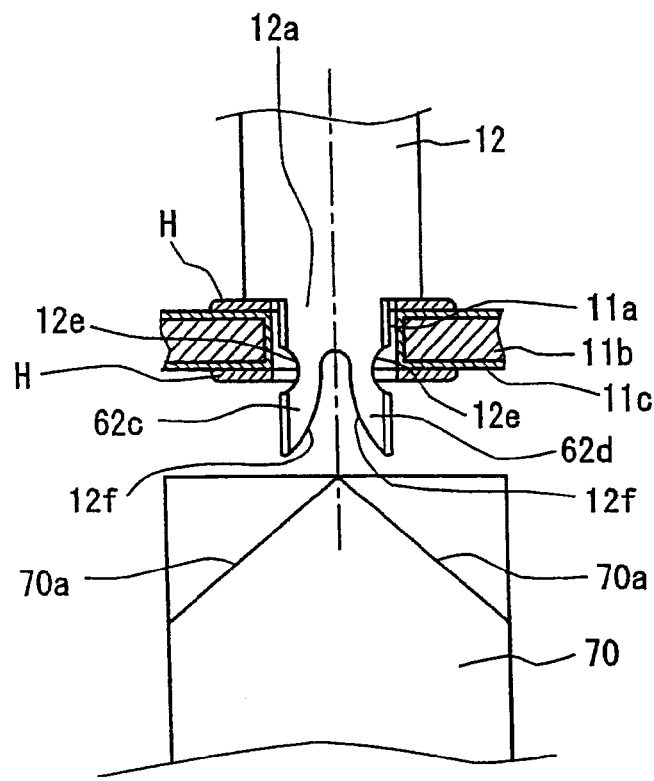
FIGS. 7A and 7B show branched terminal portions according to a second embodiment.
Figure 7B:
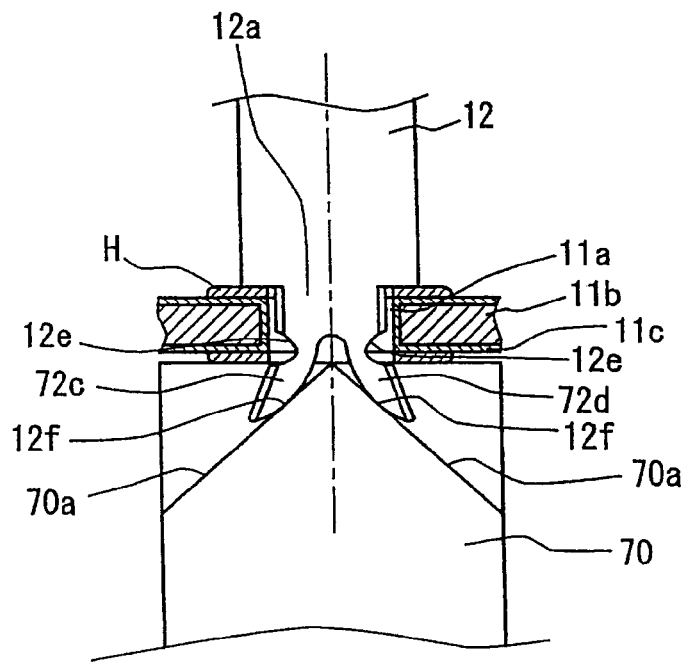

FIGS. 7A and 7B show an alteration of the branched terminal portions 42c and 42d.

Each of two branched terminal portions 62c and 62d includes a recess 12e on the outer side and an outward curved portion 12f on the inner side that is adapted to conform to the slant surfaces 70a of a jig 70. As described above, the recesses 12e help the branched terminal portions 62c and 62d to become deformed upon bending the branched terminal portions 62c and 62d, while the curved portions 12f assist the jig 70 to enter a space between the branched terminal portions.

Since the other structures and operational effects in the second embodiment are similar to those of the first embodiment, like reference numerals are given to like elements, and explanations of those elements are omitted.

Figure 8A:
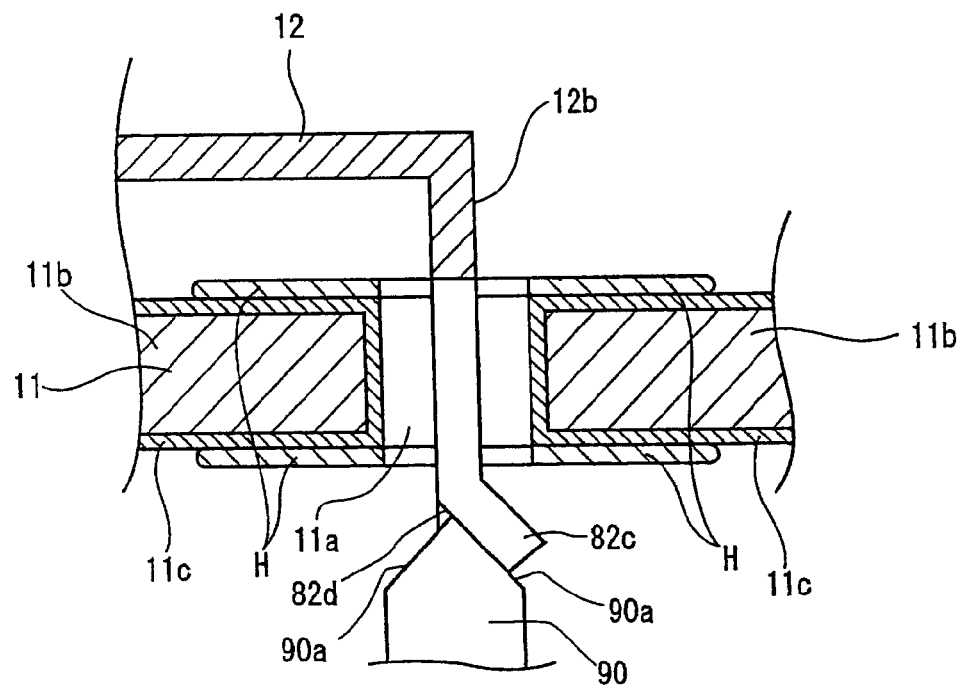
FIGS. 8A and 8B show branched terminal portions according to a third embodiment.
Figure 8B:
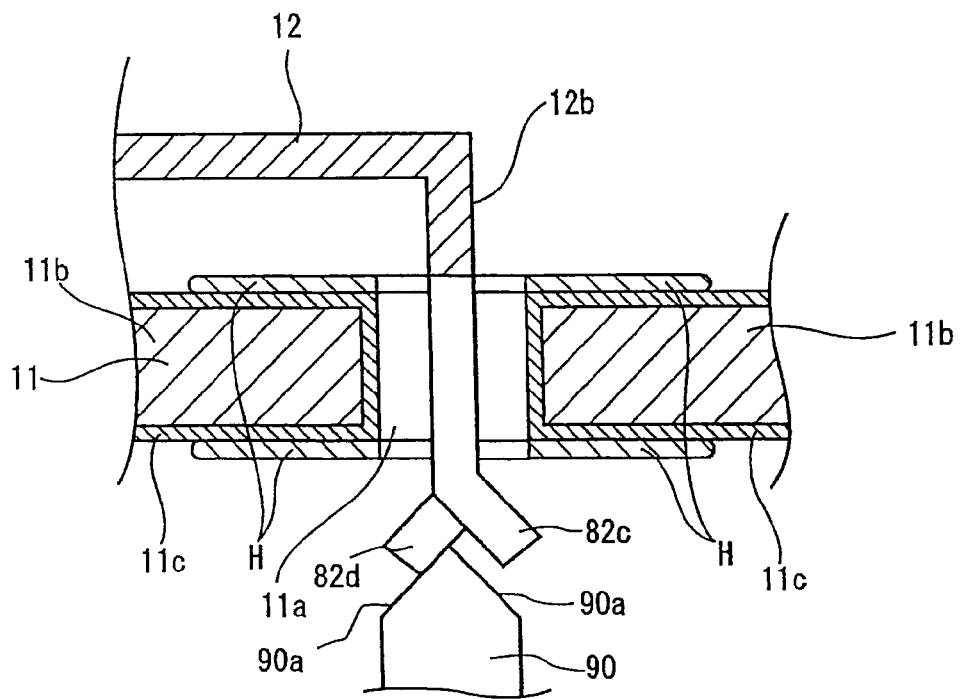
Figure 9:
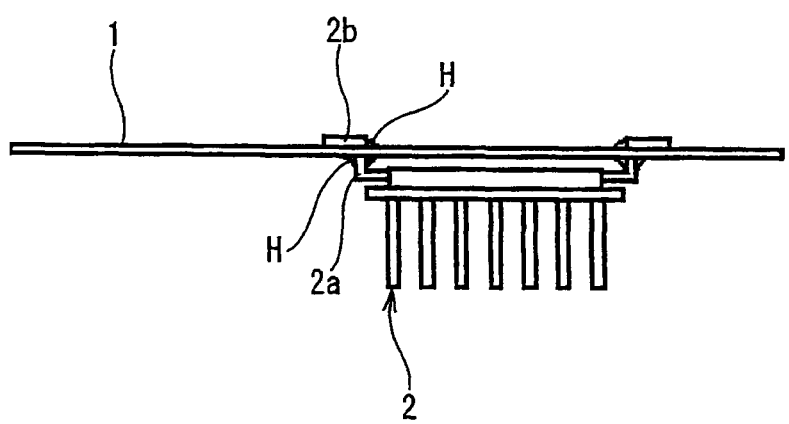
FIG. 9 is a front elevation view of a related-art printed board.

FIGS. 8A and 8B show a third exemplary embodiment of a printed board. The third exemplary embodiment differs from the first exemplary embodiment with respect to the fact that branched terminal portions 82c and 82d are bent away from each other in the thickness direction of the bus bar 12.

A second step in the third exemplary embodiment of a method for producing the printed board differs from the second step in the first exemplary embodiment. As shown in FIGS. 8A and 8B, the distal end of a jig 90 used in the third exemplary embodiment has a triangular cross section. The triangular cross section has opposed slant surfaces 90a.

One of the slant surfaces 90a on the distal end of the jig 90 contacts branched terminal portions 82c. The jig 90 is then pushed up so that the jig 90 clinches the branched terminal portions 82c to bend them in the thickness direction of the printed board body 11. Next, the other slant surface 90a of the jig 90 contacts branched terminal portions 82d. Then, the jig 90 is pushed up so that the jig 90 clinches the branched terminal portions 82d to bend them in the thickness direction of the printed board body 11.

According to the above construction, it is possible to stably hold the bus bar 12 on the printed board body 11 even if the printed board body 11 is inclined or an external load is applied to the bus bar 12.

Since the other structures and operational effects in the third exemplary embodiment are similar to those of the first exemplary embodiment, like reference numerals are given to like elements, and explanations of those elements are omitted.

While the invention has been described above in connection with exemplary embodiments, these embodiments should be viewed as illustrative and not limiting. Various changes, substitutes and/or improvements are possible within the spirit and scope of the invention.

What is claimed is:

1. A method of forming a printed board comprising:
   bonding a bonder on a through-hole in a printed board body;
   extending a terminal with a first branched portion and a second branched portion through the through-hole in the printed board body;
   bending at least one of the first branched portion or the second branched portion so as to form an acute angle with respect to a surface of the printed board body, the bent branched portion extending beyond an outer periphery of the through-hole, as seen in a plan view of the printed board body, wherein the at least one of the first branched portion or the second branched portion is bent by a jig, the jig having a slanted surface that contacts the at least one of the first branched portion or the second branched portion during the bending; and reheating the same bonder, which was previously bonded on the through-hole, so that the bonder melts and flows into the through-hole.

2. The method of forming a printed board according to claim 1, wherein the first branched portion is bent in a direction different from a direction of the second branched portion.

3. The method of forming a printed board according to claim 1, wherein the bonder is solder.

* * * * *